US006008063A

United States Patent [19]

Derraa

[11] Patent Number: 6,008,063

[45] Date of Patent: Dec. 28, 1999

[54] METHOD OF FABRICATING ROW LINES OF A FIELD EMISSION ARRAY AND FORMING PIXEL OPENINGS THERETHROUGH

[75] Inventor: Ammar Derraa, Boise, Id.

[73] Assignee: Micron Technology, Inc., Boise, Id.

[21] Appl. No.: 09/259,701

[22] Filed: Mar. 1, 1999

[51] Int. Cl.[6] .................... H01L 21/00

[52] U.S. Cl. .................... 438/20; 313/306; 313/307; 313/308; 313/309; 313/310; 313/336; 313/351

[58] Field of Search .................... 438/20; 313/306, 313/310, 336, 351

[56] References Cited

U.S. PATENT DOCUMENTS

| | | |
|---|---|---|
| 5,229,331 | 7/1993 | Doan et al. . |
| 5,372,973 | 12/1994 | Doan et al. . |
| 5,585,301 | 12/1996 | Lee et al. . |
| 5,712,534 | 1/1998 | Lee et al. . |
| 5,762,773 | 6/1998 | Rasmussen . |
| 5,767,619 | 6/1998 | Tsai et al. . |
| 5,773,927 | 6/1998 | Zimlich . |

*Primary Examiner*—John F. Niebling
*Assistant Examiner*—David A. Zarneke
*Attorney, Agent, or Firm*—Trask, Britt & Rossa

[57] ABSTRACT

A method of fabricating row lines over a field emission array. The method employs only two mask steps to define row lines and pixel openings through selected regions of each of the row lines. In accordance with the method of the present invention, a layer of conductive material is disposed over a substantially planarized surface of a grid of semiconductive material. A layer of passivation material is then disposed over the layer of conductive material. In one embodiment of the method, a first mask may be employed to remove passivation material and conductive material from between adjacent rows of pixels and from substantially above each of the pixels of the field emission array. A second mask is employed to remove semiconductive material from between the adjacent rows of pixels. In another embodiment of the method, a first mask is employed to facilitate removal of passivation material, conductive material, and semiconductive material from between adjacent rows of pixels of the field emission array. A second masks employed to facilitate the removal of passivation material and conductive material from the desired areas of pixel openings. The present invention also includes field emission arrays having a semiconductive grid and a relatively thin passivation layer exposed between adjacent row lines.

45 Claims, 15 Drawing Sheets

METHOD OF FABRICATING ROW LINES OF A FIELD EMISSION ARRAY AND FORMING PIXEL OPENINGS THERETHROUGH

This invention was made with Government support under Contract No. ARPA-95-42 MDT-00061 awarded by Advanced Research Projects Agency (ARPA). The Government has certain rights in this invention.

BACKGROUND OF THE INVENTION

1. Field of the Invention: The present invention relates to methods of fabricating row lines over a planarized semiconductive grid of a field emission array. Particularly, the present invention relates to row line fabrication methods that employ only two mask steps to define row lines and pixel openings therethrough.

2. Background of the Related Art: Typically, field emission displays ("FEDs") include an array of pixels, each of which includes one or more substantially conical emitter tips. The array of pixels of a field emission display is typically referred to as a field emission array. Each of the emitter tips is electrically connected to a negative voltage source by means of a cathode conductor line, which is also typically referred to as a column line.

Another set of electrically conductive lines, which are typically referred to as row lines or as gate lines, extends over the pixels of the field emission array. Row lines typically extend across a field emission display substantially perpendicularly to the direction in which the column lines extend. Accordingly, the paths of a row line and of a column line typically cross proximate (i.e., above and below, respectively) the location of an emitter tip. The row lines of a field emission array are electrically connected to a relatively positive voltage source. Thus, as a voltage is applied across the column line and the row line, electrons are emitted by the emitter tips and accelerated through an opening in the row line.

As electrons are emitted by emitter tips and accelerate past the row line that extends over the pixel, the electrons are directed toward a corresponding pixel of a positively charged electro-luminescent panel of the field emission display, which is spaced apart from and substantially parallel to the field emission array. As electrons impact a pixel of the electro-luminescent panel, the pixel is illuminated.

An exemplary method of fabricating field emission arrays is taught in U.S. Pat. No. 5,372,973 (hereinafter "the '973 Patent"), issued to Trung T. Doan et al. on Dec. 13, 1994. The field emission array fabrication method of the '973 Patent includes an electrically conductive grid, or gate, disposed over the surface thereof and including apertures substantially above each of the emitter tips of the field emission array. Known processes, including chemical mechanical planarization ("CMP") and a subsequent mask and etch, are employed to provide a substantially planar grid surface and to define the apertures therethrough. While the electrically conductive grid of the field emission array disclosed in the '973 Patent is fabricated from an electrically conductive material such as chromium, field emission displays that include grids of semiconductive material, such as silicon, are also known.

Typically, in fabricating row lines over planarized field emission arrays that include grids of semiconductive material, three separate mask steps and subsequent etches are employed. With reference to FIGS. 1A and 2A, a first mask 28 is typically required to remove semiconductive material of grid 122 from the areas between adjacent rows of emitters tips 114 and thereby define row lines 132 of the remaining portions of the semiconductive grid 122 and expose regions of dielectric layer 120 between adjacent row lines 132. FIGS. 1B and 2B illustrate the use of a second mask 136 to remove conductive material 126, which is deposited over grid 122 of semiconductive material, from the areas between adjacent row lines 132 in order to further define row lines 132 through the conductive material 126, and from the portion of row lines 132 overlying each pixel 112 or emitter tip 114 in order to form pixel openings 140 that facilitate the travel of electrons emitted from emitter tips 114 through apertures 124 of grid 122 and past row lines 132. With reference to FIGS. 1C and 2C, a third mask 150 is required to remove passivation material 134 disposed over row lines 132 from pixel openings 140.

The use of three separate masks undesirably increases fabrication time and costs, as three separate photoresist deposition steps, three separate photoresist exposure steps, and three separate mask removal steps are required. Accordingly, row line fabrication processes that require three mask steps are somewhat inefficient.

Accordingly, there is a need for a field emission array row line fabrication method that requires fewer than three mask steps and, consequently, that increases the efficiency with which row lines are fabricated while reducing the likelihood of failure of the field emission arrays and the costs associated with fabricating field emission arrays.

SUMMARY OF THE INVENTION

The present invention includes a method of fabricating row lines on a planarized semiconductive grid of a field emission display. The row line fabrication method of the present invention employs two mask steps to define the row lines over the field emission array and to define pixel openings through the row lines.

According to the present invention, the column lines, emitter tips, overlying planarized semiconductive grid, and apertures through the semiconductive grid above the emitter tips of a field emission array may be fabricated by known processes. Each pixel of the field emission array may include one or more emitter tips, as known in the art.

A layer of conductive material may then be disposed over the substantially planar surface of the semiconductive grid of the field emission array. A layer of passivation material may then be disposed over the layer of conductive material.

In a first embodiment of the row line fabrication method of the present invention, a first mask, including a first set of apertures alignable between adjacent rows of pixels of the field emission array and a second set of apertures alignable over pixels of the field emission array, is employed to partially define the row lines of the field emission array and to define the pixel openings through the row lines. The first mask, which may be fabricated by known processes, is disposed over the layer of passivation material. Passivation material exposed through the first and second sets of apertures of the first mask is then removed by known techniques, such as etching. Next, portions of the layer of conductive material that underlie the apertures, that are substantially within a periphery of each aperture, and that are exposed through the first set of apertures and through the second set of apertures of the first mask or that are exposed through the previously etched layer of passivation material are removed, such as by known etching techniques.

Another, second mask is employed to further define the row lines, and includes apertures alignable between adjacent rows of pixels of the field emission array. The second mask may be fabricated and disposed over the field emission array as known in the art. Material may be removed from the semiconductive grid through the apertures of the second mask, for example by known etching techniques, to define the row lines.

In an alternative embodiment of the row line fabrication method of the present invention, the first mask may only include apertures alignable between adjacent rows of pixels of the field emission array. The apertures of the first mask facilitate removal of underlying passivation material, conductive material, and semiconductive material substantially within the peripheries of the apertures, such as by known etching techniques for each of these materials. The second mask includes apertures alignable over pixels of the field emission array. The passivation material underlying, and substantially within the peripheries of each of the apertures of the second mask, and exposed through the apertures of the second mask may be removed by known techniques, such as by etching. The conductive material that is then exposed through the apertures of the second mask or through the regions of the overlying layer of passivation material from which passivation material was removed is then removed by known processes, such as etching.

The field emission array may then be assembled with other components of a field emission display, such as the display screen, housing, and other components thereof, as known in the art.

Other features and advantages of the present invention will become apparent to those of skill in the art through a consideration of the ensuing description, the accompanying drawings, and the appended claims.

DETAILED DESCRIPTION OF THE INVENTION

Figure 1A:
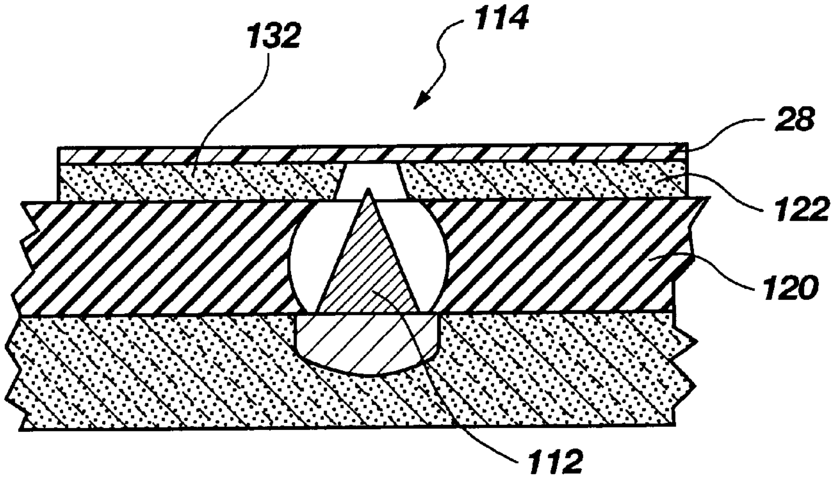
FIGS. 1A–1C are cross-sectional schematic representations of a known three-mask step method of fabricating a row line over a pixel of a planarized field emission array.
Figure 2A:
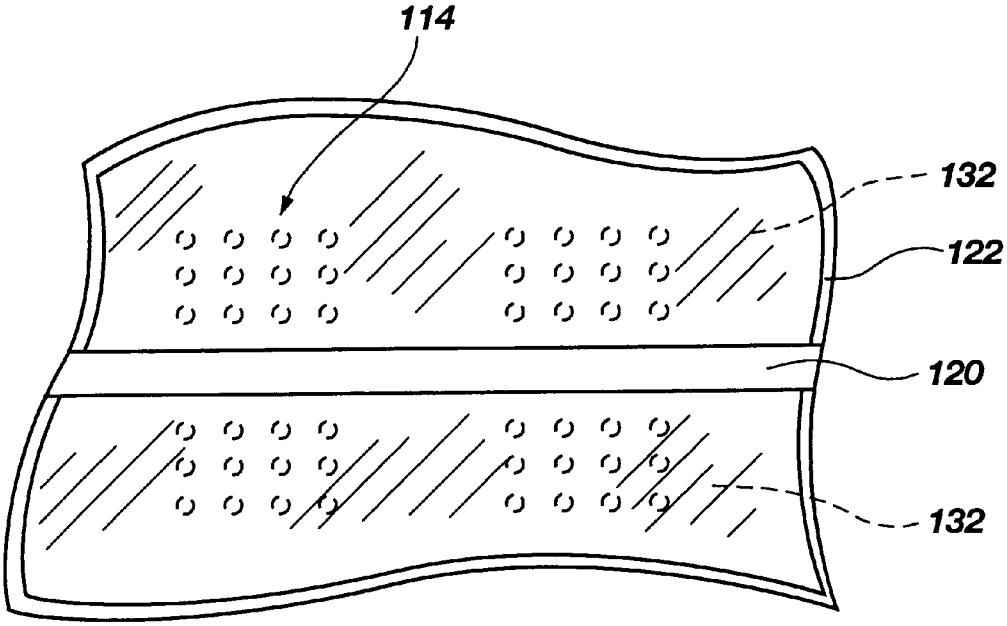
FIGS. 2A–2C are top views that schematically illustrate the three-mask step method of FIGS. 1A–1C, respectively.
Figure 1B:
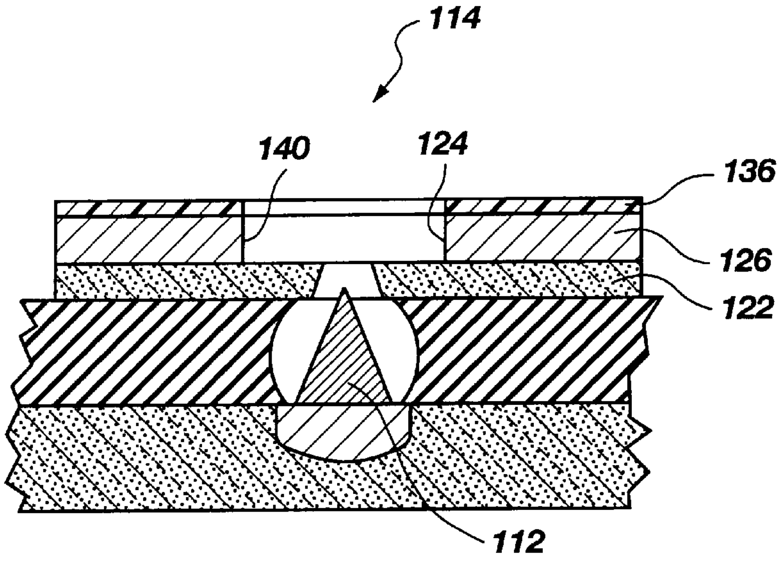
Figure 2B:
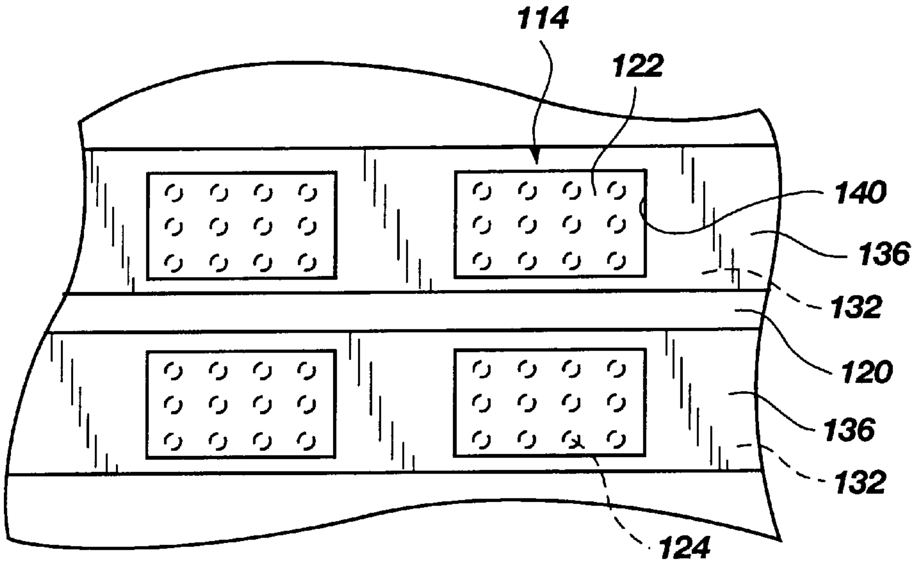
Figure 1C:
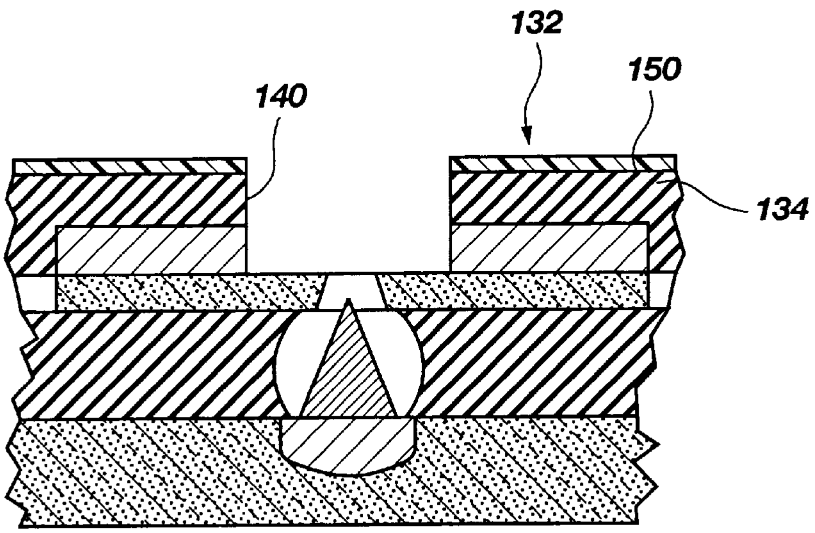
Figure 2C:
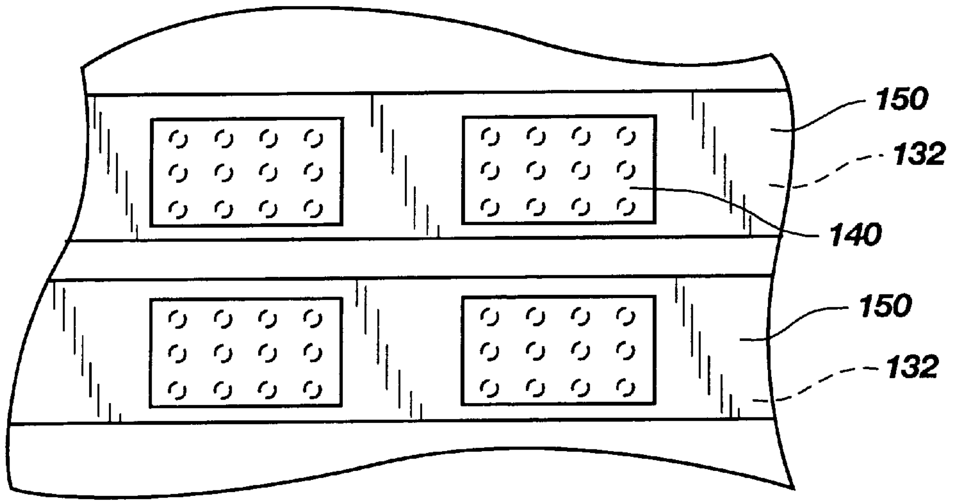
Figure 3A:
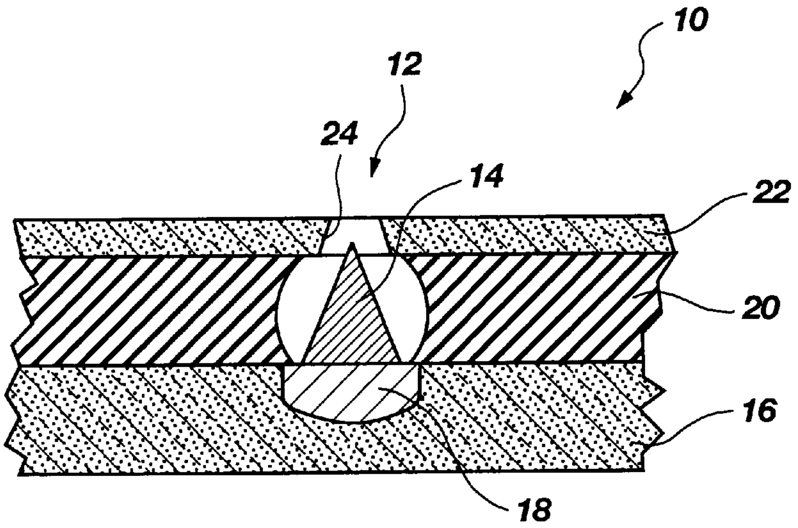
FIG. 3A is a cross-sectional schematic representation of a pixel of a planarized semiconductive grid of a field emission array upon which row lines may be fabricated in accordance with the method of the present invention.
Figure 3B:
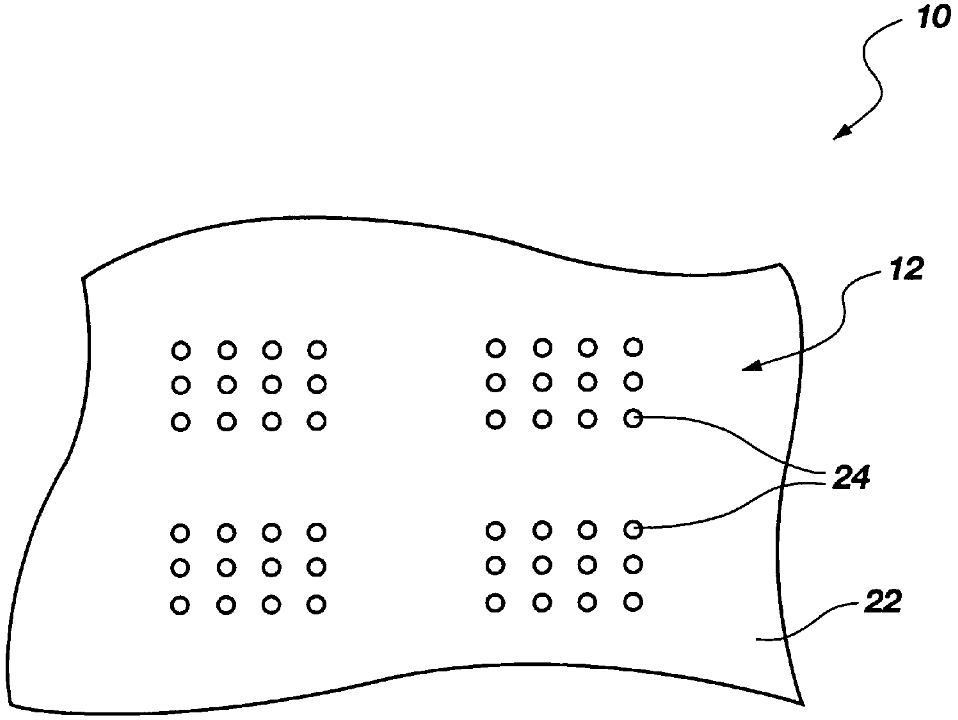
FIG. 3B is a top view that schematically illustrates a field emission array such as that shown in FIG. 3A, wherein each of the pixels includes a plurality of emitter tips.

FIGS. 3A and 3B illustrate a chemically-mechanically polished (CMP) field emission array 10, which includes an array of pixels 12. FIG. 3A illustrates a pixel 12 that includes a single emitter tip 14. FIG. 3B is a top view of field emission array 10, showing pixels 12 that each include twelve emitter tips 14. Field emission array 10 includes a semiconductor substrate 16 through which column lines 18 extend. Column lines 18 extend beneath each of the pixels 12 of a column of pixels 12 of field emission array 10, and are in electrical communication with the emitter tips 14 of each of pixels 12. A dielectric layer 20 is disposed laterally adjacent each pixel 12 of field emission array 10. A grid 22 of semiconductive material is located above dielectric layer 20 and includes apertures 24 therethrough, substantially directly above each emitter tip 14. Preferably, grid 22 has a substantially planar surface.

Figure 4A:
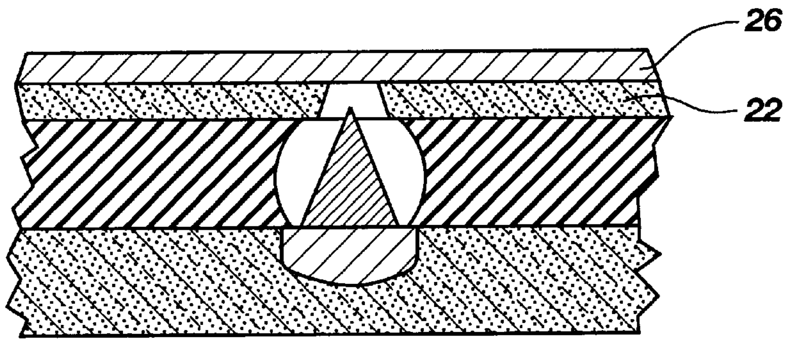
FIGS. 4A and 4B schematically illustrate the disposition of a layer of conductive material over the field emission arrays of FIGS. 3A and 3B, respectively.
Figure 4B:
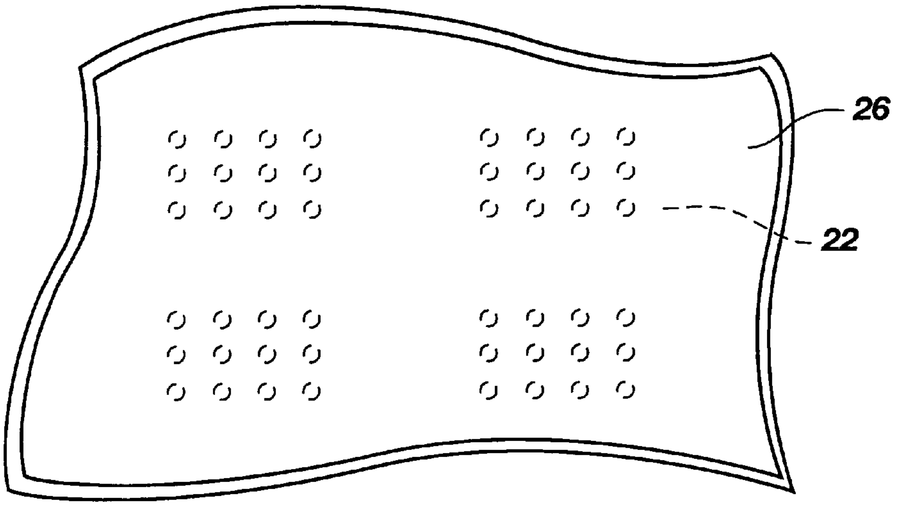

Referring to FIGS. 4A and 4B, a layer 26 of conductive material, which is also referred to herein as a conductive layer, is disposed over grid 22. As the conductive material of layer 26 may comprise electrically conductive materials that are known to be useful in fabricating electrically conductive traces of semiconductor devices, such as polysilicon, molybdenum, chromium, aluminum and other electrically conductive materials, known techniques may be employed to deposit layer 26. For example, depending upon the desired conductive material of layer 26, as well as the desired thickness and consistency of layer 26, the conductive material thereof may be deposited by known physical vapor deposition ("PVD") techniques, such as sputtering, or known chemical vapor deposition ("CVD") techniques, such as plasma enhanced CVD ("PECVD"), low pressure CVD ("LPCVD"), or atmospheric pressure CVD ("APCVD").

Figure 5A:
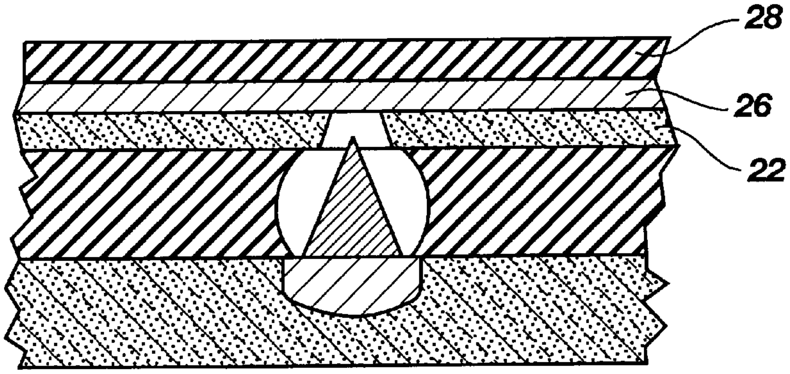
FIGS. 5A and 5B schematically illustrate the disposition of a layer of passivation material over the field emission arrays of FIGS. 4A and 4B, respectively.
Figure 5B:
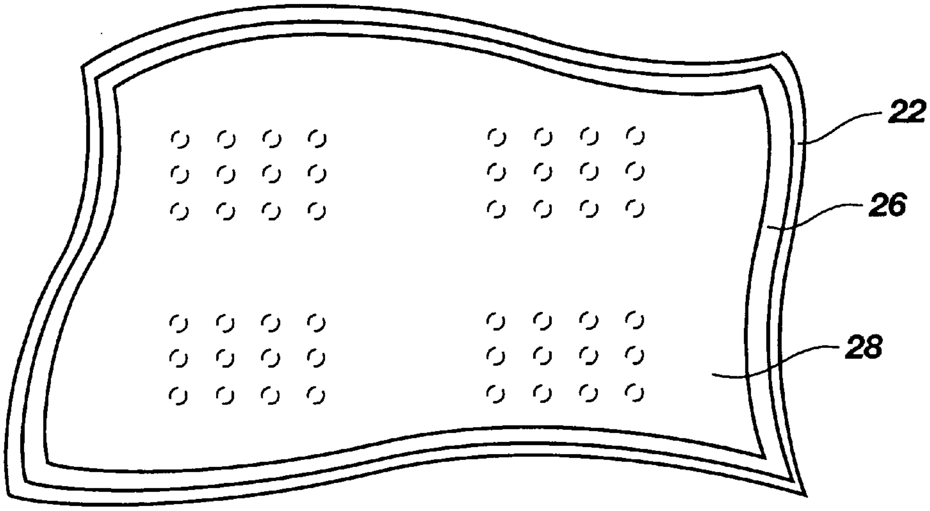

With reference to FIGS. 5A and 5B, the row line fabrication method of the present invention includes forming a layer 28 of passivation material, which is also referred to herein as a passivation layer, over layer 26. Layer 28 may comprise passivation material that is either disposed over selected regions of layer 26 or disposed over the substantial entirety of layer 26. Passivation materials that are useful for fabricating layer 28 include, without limitation, glasses, such as borophosphosilicate glass (BPSG), phosphosilicate glass (PSG), or borosilicate glass (BSG), silicon oxides, other oxides, silicon nitrides, or other passivation materials that may be used in fabricating semiconductor devices or field emission arrays. Accordingly, layer 28 may be disposed over layer 26 by known glass deposition techniques (e.g., CVD or spin-on glass ("SOG")), grown over grid 22 by known oxidation techniques, or deposited over grid 22 by known TEOS deposition techniques or silicon nitride deposition techniques.

Figure 6A:
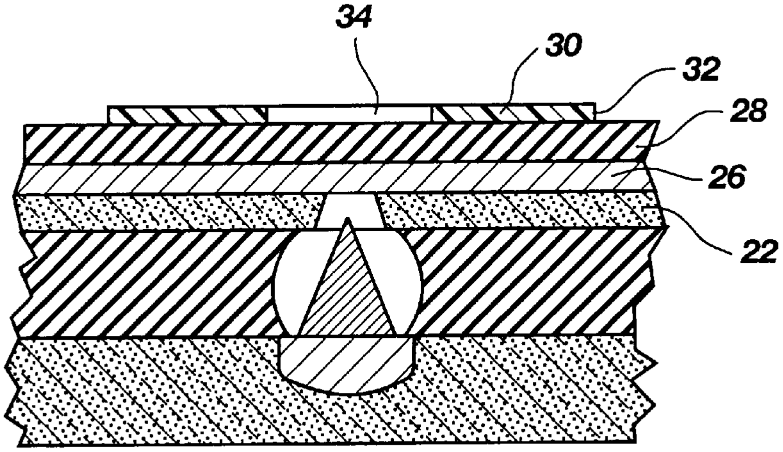
FIGS. 6A and 6B schematically illustrate the disposition of a first mask over the field emission arrays of FIGS. 5A and 5B, respectively.
Figure 6B:
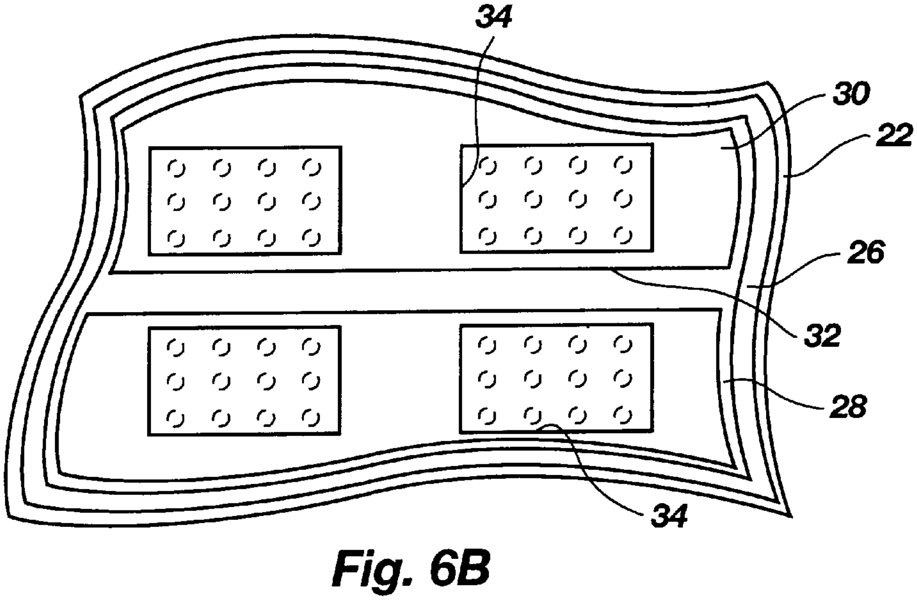

Turning now to FIGS. 6A and 6B, a first mask 30, including a first set of apertures 32 alignable between adjacent rows of pixels 12 and a second set of apertures 34 alignable over pixels 12, is disposed over layer 28. Mask 30 may be formed by known techniques, such as by disposing photoresist material over layer 28 and exposing and developing selected regions of the photoresist to define first set of apertures 32 and second set of apertures 34.

Figure 7A:
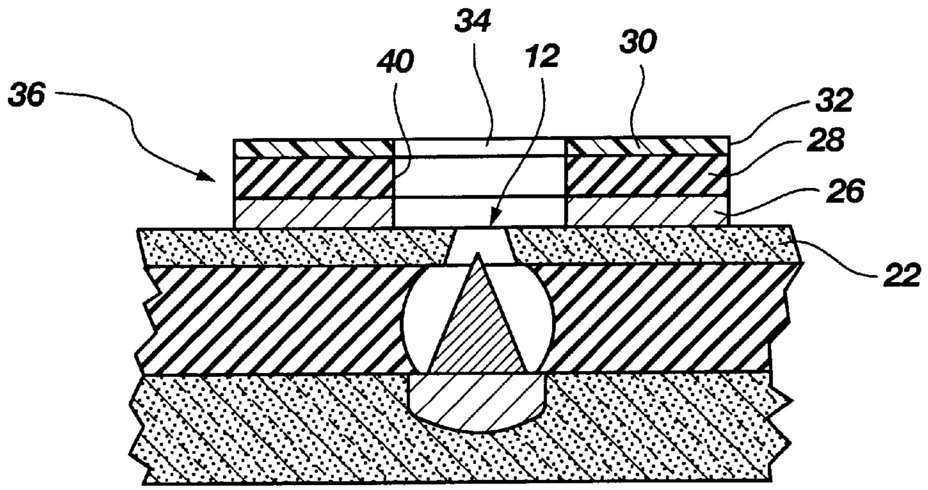
FIGS. 7A and 7B schematically illustrate the removal of passivation material and conductive material, as facilitated by the apertures of the first mask of FIGS. 6A and 6B, to partially define row lines and to define pixel openings through the row lines of the field emission arrays of FIGS. 6A and 6B, respectively.
Figure 7B:
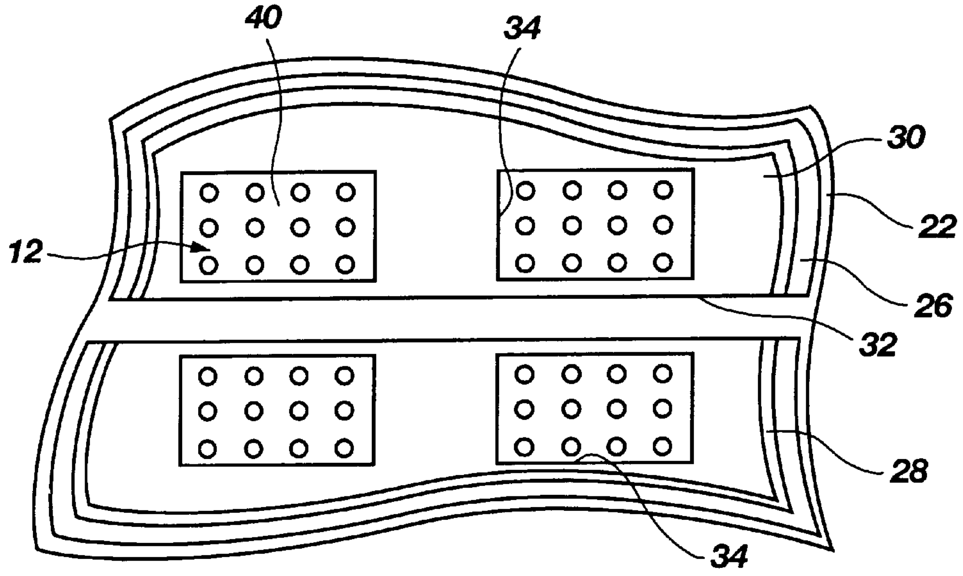

FIGS. 7A and 7B illustrate the removal of passivation material of layer 28 through first set of apertures 32 and through second set of apertures 34. FIGS. 7A and 7B also illustrate the removal of conductive material of layer 26 through first set of apertures 32 and second set of apertures 34 or through apertures defined through layer 26 during the removal of passivation material through first set of apertures 32 and second set of apertures 34. The passivation material of layer 28 may be removed by known processes, such as by dry etching or wet etching.

Dry etching techniques that may be employed to remove passivation material through first set of apertures 32 and second set of apertures 34 include, without limitation, glow-discharge sputtering, ion milling, reactive ion etching ("RIE"), reactive ion beam etching ("RIBE"), and high-density plasma etching.

Dry etchants, such as known fluorine and chlorine dry etchants (e.g., $BCl_3$, $CCl_4$, $Cl_2$, $SiCl_4$, $CF_4$, $CHF_3$, $C_2F_6$, $C_3F_8$, etc.), and other known silicon oxide or glass etchants, may be employed in any of the foregoing dry etch techniques to remove passivation materials that include silicon oxide (e.g., $SiO_2$, BPSG, PSG, BSG, etc.) from selected regions of layer 28. Dry etchants that are useful for removing silicon nitride in accordance with the method of the present invention include, without limitation, $CF_4$ and $O_2$ or $NF_3$. The silicon nitride dry etchants may also be employed in known dry etch processes. Of course, other known etchants, including other dry etchants and wet etchants, may be employed to remove these and other passivation materials from the desired areas of layer 28.

With continued reference to FIGS. 7A and 7B, conductive material of the regions of layer 26 that overlie each pixel 12 and that are to be located between adjacent row lines 36 may be removed from field emission array 10 through first set of apertures 32 and second set of apertures 34, or through apertures that were defined in layer 28 during the removal of passivation material therefrom. Known dry etch or wet etch processes may be employed to remove the conductive material of layer 26 from field emission array 10. Once again, known dry etch techniques may be employed to remove conductive material of layer 26. If the conductive material of layer 26 comprises polysilicon, dry etchants including, without limitation, a combination of $SF_6$ and $Cl_2$, which exhibits good selectivity for polysilicon over single-crystalline silicon, may be employed. If the conductive material of layer 26 comprises molybdenum, dry etchants such as $CF_4$, $SF_4$, or $SF_6$ may be employed. When other conductive materials are employed in layer 26, other known dry etchants for the particular type of conductive material employed may be used to remove the conductive material from the desired regions of layer 26. Of course, depending upon the type of conductive material employed in layer 26, known wet etchants of that type of conductive material and known wet etch processes may be employed to remove the conductive material from layer 26.

Upon removal of passivation material of layer 28 and of conductive material of layer 26 from above pixels 12 and from between the desired locations of adjacent row lines 36, pixel openings 40 are defined and row lines 36 are partially defined through layers 28 and 26.

Following the removal of desired amounts of passivation material and conductive material from layers 28 and 26, respectively, the etchants employed may be removed from field emission array 10 by known processes, such as by washing field emission array 10. Mask 30 may also be removed by known processes.

Figure 8A:
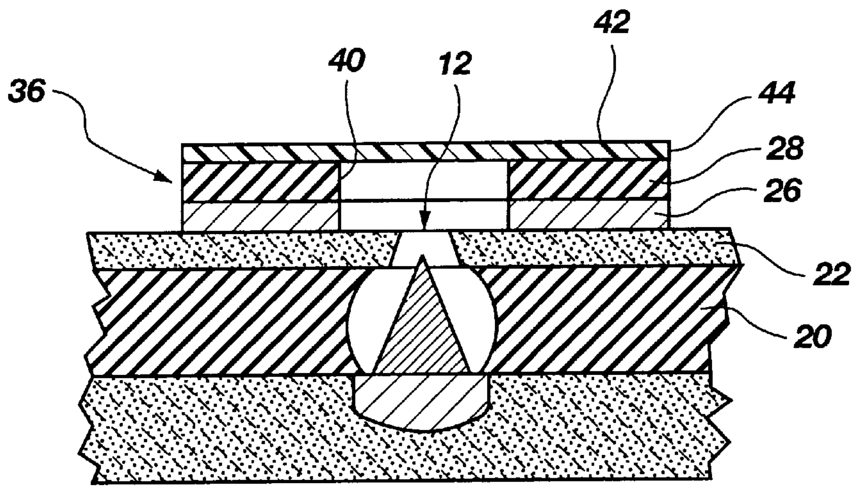
FIGS. 8A and 8B schematically illustrate the disposition of a second mask over the field emission arrays of FIGS. 7A and 7B, respectively.
Figure 8B:
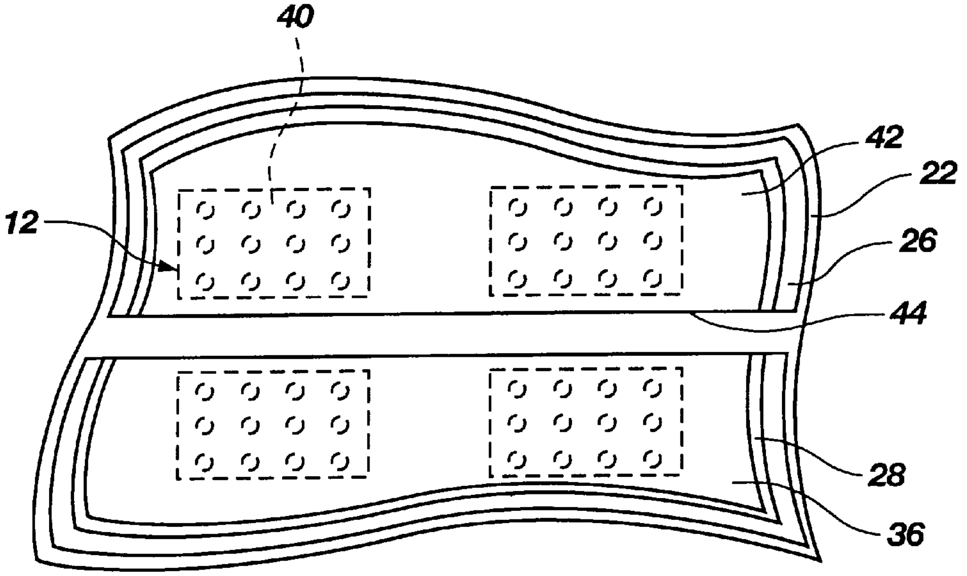

Turning now to FIGS. 8A and 8B, a second mask 42, including a set of apertures 44 alignable between adjacent row lines 36 of field emission array 10, is disposed over field emission array 10. Mask 42 may be formed on field emission array 10 by known techniques, such as by disposing a photoresist material over the exposed surface of field emission array 10 and exposing and developing selected regions of the photoresist material to define mask 42 and apertures 44 therethrough.

Figure 9A:
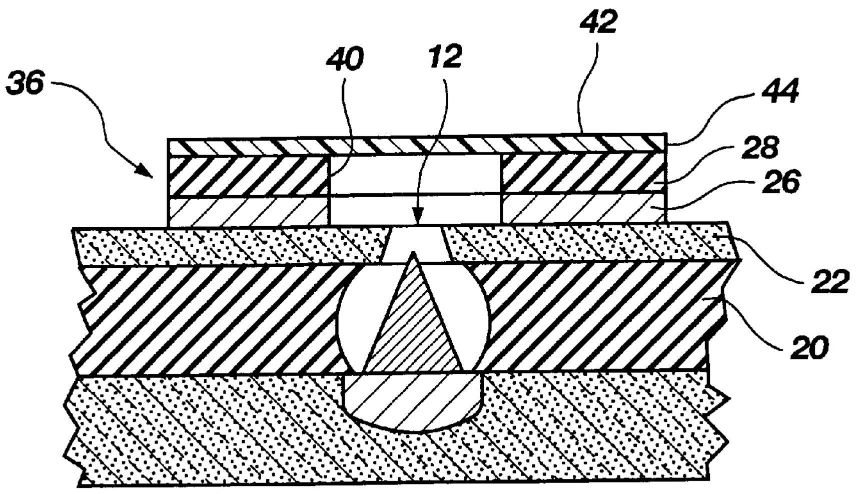
FIGS. 9A and 9B schematically illustrate the removal of semiconductive material through the apertures of the second mask of FIGS. 8A and 8B to further define row lines of the field emission arrays of FIGS. 8A and 8B, respectively.
Figure 9B:
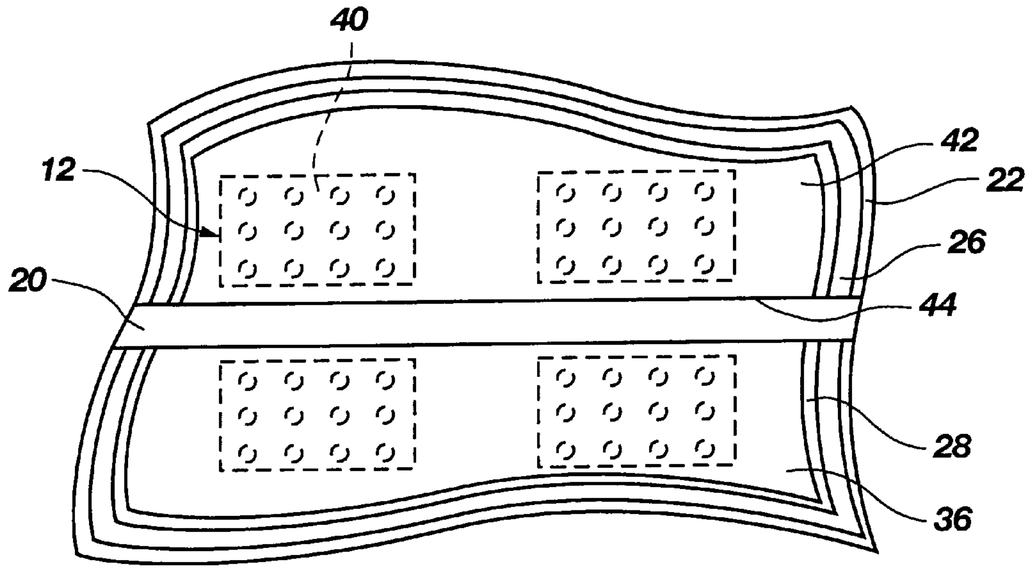

Referring now to FIGS. 9A and 9B, semiconductive material of grid 22 may be removed from grid 22 in locations between adjacent row lines 36 by known processes in order to further define row lines 36. For example, either dry etch or wet etch processes may be employed to remove the semiconductive material of grid 22 through apertures 44. Dry etch processes, such as those disclosed with reference to FIGS. 7A and 7B and their accompanying written description, may be employed to remove semiconductive material from grid 22 through apertures 44. If the semiconductive material of grid 22 comprises silicon, dry etchants, such as $CCl_4$, $Cl_2$, $SiCl_4$, $CF_4$, $SF_4$, or $SF_6$, may be used in conjunction with these dry etch processes to remove the semiconductive material of grid 22 exposed through apertures 44. Of course, known wet etchants and wet etch processes may alternatively be employed to remove semiconductive materials, such as silicon, through apertures 44.

Following the removal of semiconductive material from the desired areas of grid 22, the etchant employed may be removed from field emission array 10 by known processes, such as by washing field emission array 10. Mask 42 may also be removed by known processes.

Alternatively, with reference to FIGS. 6C, 6D, 7C, 7D, 8C, 8D, 9C, and 9D, another embodiment of the process of defining row lines 36' (see, e.g., FIGS. 10A and 10B) through layers 28 and 26 and through grid 22 is depicted.

Figure 6C:
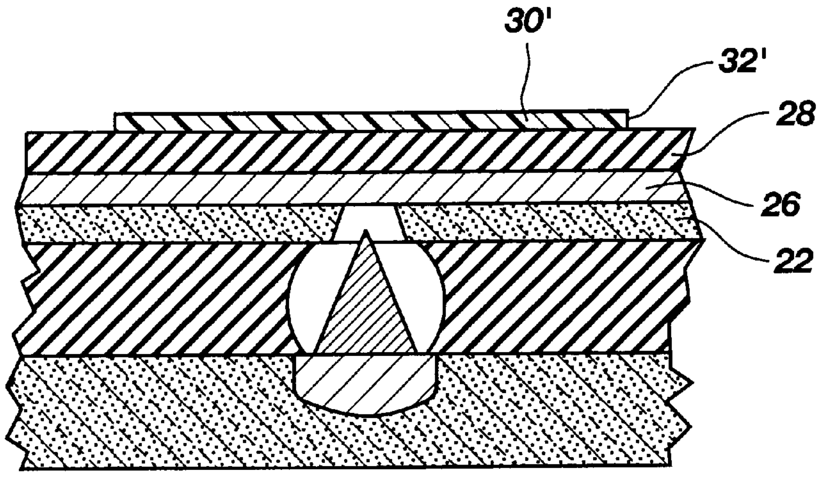
FIGS. 6C and 6D schematically illustrate the disposition of a variation of the first mask over the field emission arrays of FIGS. 5A and 5B, respectively.
Figure 6D:
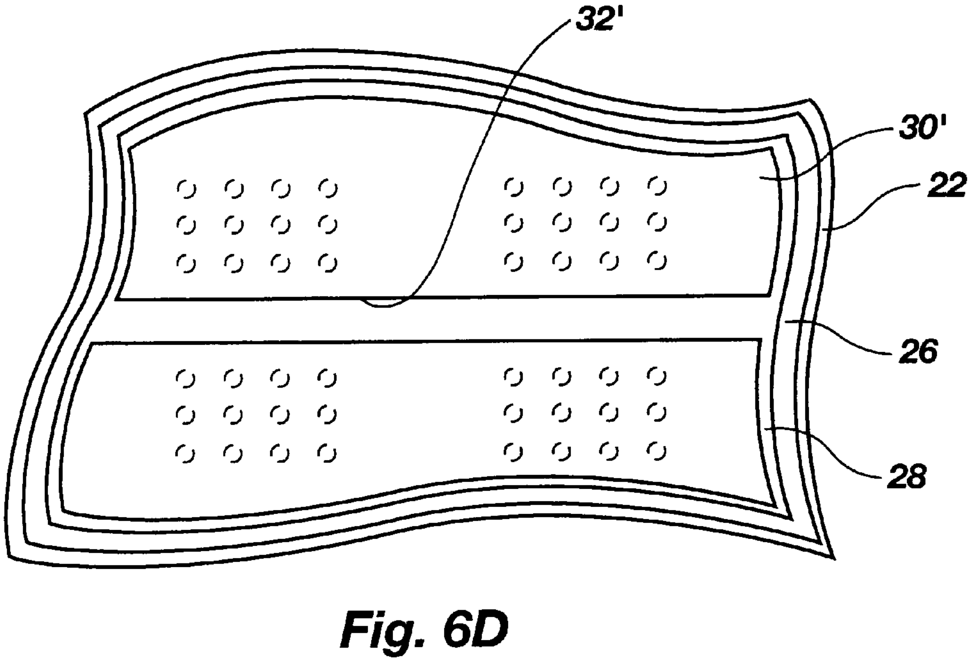

With reference to FIGS. 6C and 6D, a first mask 30', which includes apertures 32' alignable between adjacent rows of pixels 12, is disposed over layer 28. Mask 30' may be formed by known techniques, such as by disposing a photoresist material over layer 28 and exposing and developing selected regions of the photoresist to define apertures 32'.

Figure 7C:
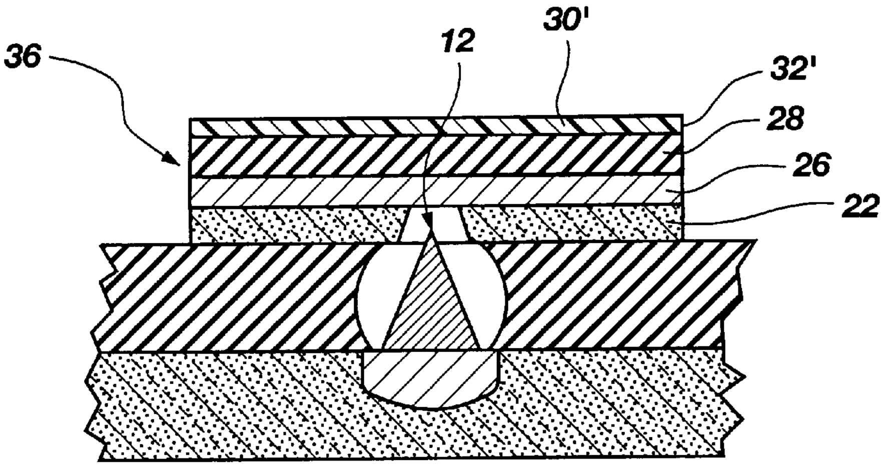
FIGS. 7C and 7D schematically illustrate the removal of passivation material, conductive material, and semiconductive material, as facilitated by the apertures of the first mask of FIGS. 6C and 6D, to define row lines of the field emission arrays of FIGS. 6C and 6D, respectively.
Figure 7D:
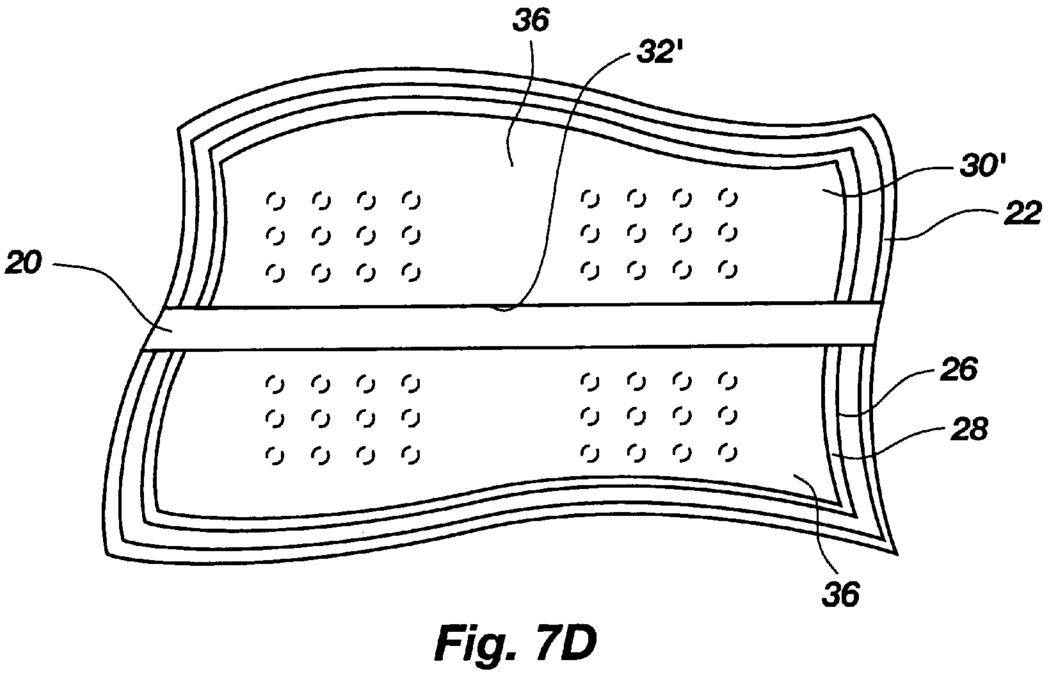

Turning to FIGS. 7C and 7D, passivation material of layer 28 may be removed through apertures 32' by known processes, such as by the etch techniques and with the etchants disclosed above in reference to FIGS. 7A and 7B, to begin defining row lines 36. If passivation material is removed from the desired areas of layer 28 with an etchant, the removal of the passivation material from layer 28 may be terminated or etchant removed from field emission array 10 by known processes, such as by washing field emission array 10.

The conductive material of layer 26 may then be removed through apertures 32' or through the regions of layer 28 from which passivation material was removed in order to define row lines 36 from layer 26. Conductive material may be removed by the processes and with the etchants disclosed above in reference to FIGS. 7A and 7B or as otherwise known in the art. If etchants are employed, the etchants may be subsequently removed from field emission array 10 by known processes, such as by washing.

To further define row lines 36, the semiconductive material of grid 22 may be removed through apertures 32' or through the regions of layers 26 and 28 from which conductive material and passivation material, respectively, were previously removed. The semiconductive material may be removed as known in the art, such as by the processes employing the etchants disclosed above in reference to FIGS. 9A and 9B.

Once the semiconductive material has been removed from the desired areas of grid 22, known techniques, such as washing processes, may be employed to terminate the removal of semiconductive material from grid 22 or to remove etchants from field emission array 10. Mask 30' may also be removed by known processes.

Figure 8C:
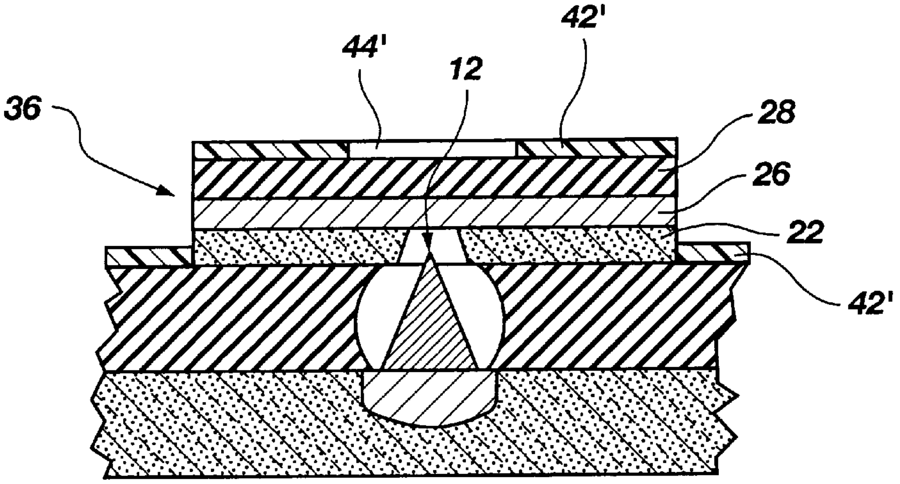
FIGS. 8C and 8D schematically illustrate the disposition of a variation of the second mask over the field emission arrays of FIGS. 7C and 7D, respectively.
Figure 8D:
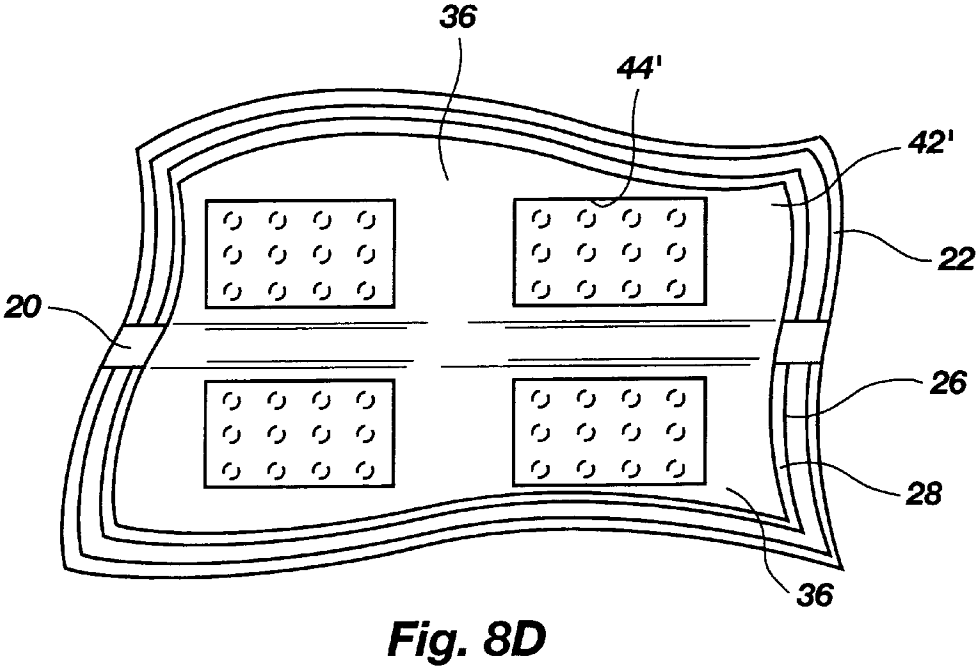

FIGS. 8C and 8D illustrate the disposition of a second mask 42', which includes apertures 44' alignable over pixels 12, over layer 28 of field emission array 10. Mask 42' may be formed by known processes, such as by disposing a photoresist material over layer 28 and exposing and developing selected regions of the photoresist material to define apertures 44' therethrough.

Figure 9C:
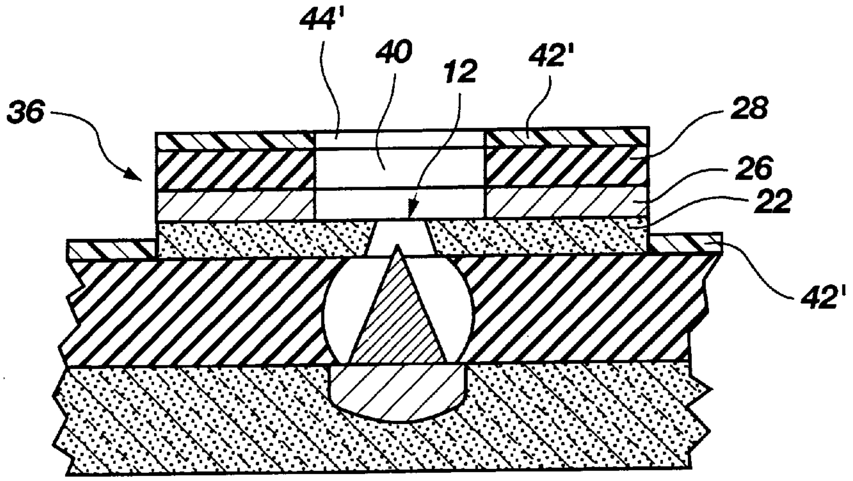
FIGS. 9C and 9D schematically illustrate the removal of passivation material and conductive material, as facilitated by the apertures of the second mask of FIGS. 8C and 8D, to define pixel openings over the pixels of the field emission arrays of FIGS. 8C and 8D, respectively.
Figure 9D:
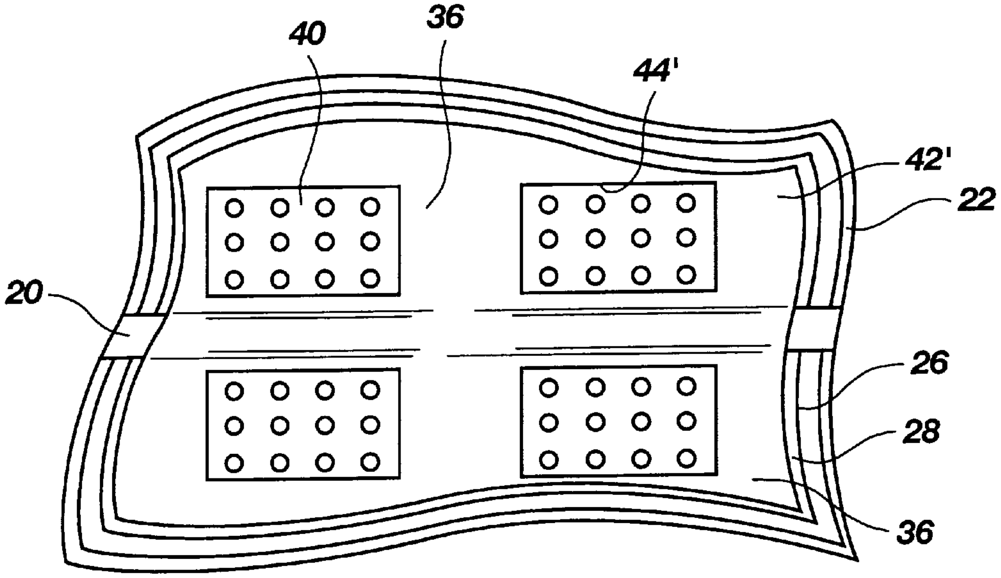

Turning to FIGS. 9C and 9D, pixel openings 40 may be defined through apertures 44' by removing the passivation material of the portions of layer 28 that are exposed through apertures 44', as well as the substantially underlying portions of layer 26 of semiconductive material, from grid 22. The passivation material of layer 28 may be removed through apertures 44' by known processes, such as by the passivation material etch processes and with the etchants disclosed above in reference to FIGS. 7A and 7B. If an etchant is employed to remove the passivation material from desired areas of layer 28, the etchant may be removed from field emission array 10 by known techniques, such as by washing field emission array 10.

The conductive material of layer 26 exposed through layer 28 may then be removed through apertures 44' or through the portions of layer 28 from which passivation material was previously removed. The conductive material may be removed by known processes, such as by the etch techniques that employ the etchants disclosed above in reference to FIGS. 7A and 7B. If etchants are employed to remove conductive material from desired areas of layer 26, known techniques, such as washing, may be employed to terminate the removal of conductive material or to remove etchant from field emission array 10.

Upon removal of passivation material and conductive material located beneath mask 42' and substantially beneath apertures 44' and within the peripheries thereof, pixel openings 40 are defined through layers 28 and 26 and grid 22 is exposed therethrough. Mask 42' may also be removed by known processes.

As each of first mask 30' and second mask 42' include only a single set of apertures 32' and 44', respectively, row lines 36 may be defined either before or after pixel openings 40 are defined.

Figure 10A:
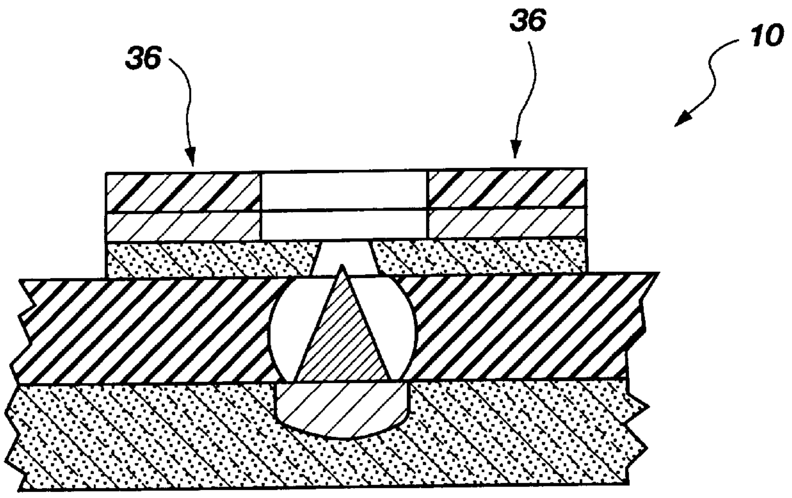
FIGS. 10A and 10B schematically illustrate a field emission array including row lines extending over the surface thereof that were fabricated in accordance with the method of the present invention.
Figure 10B:
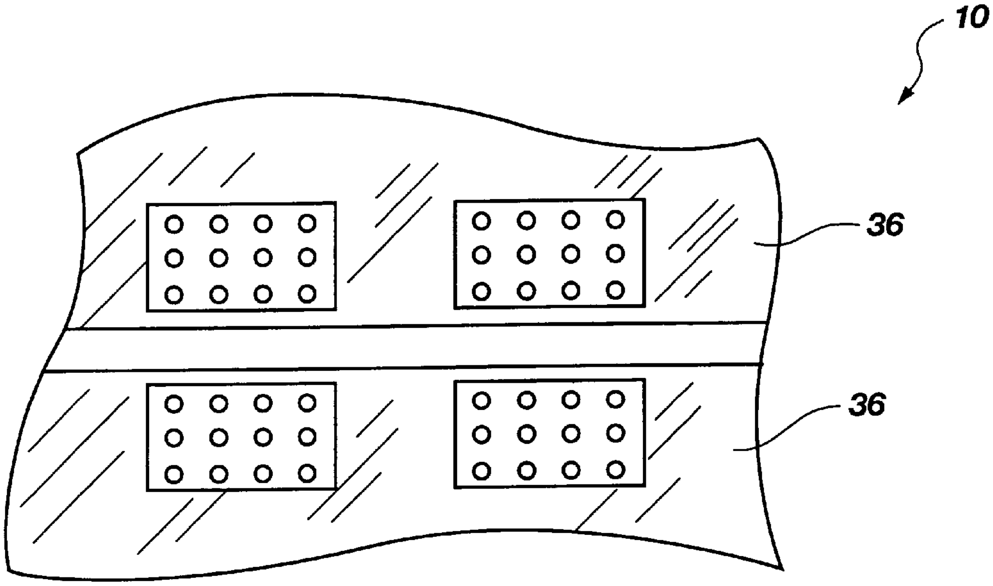

FIGS. 10A and 10B illustrate a field emission array 10 including row lines 36 that have been fabricated in accordance with the methods of the present invention.

As the methods of the present invention only require two mask steps, these methods may be more efficient than conventional processes for fabricating the row lines and pixel openings of field emission arrays with planarized semiconductive grids. Thus, the methods of the present invention may decrease the failure rates and fabrication costs of field emission arrays that include planarized semiconductive grids.

Although the foregoing description contains many specifics and examples, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method of fabricating row lines of a field emission array, comprising:

disposing a first layer of conductive material over a semiconductive grid of the field emission array;

disposing a second layer of passivation material over said first layer;

disposing a first mask, including a first set of apertures, each alignable substantially over a pixel of the field emission array, over the field emission array;

removing passivation material of said second layer exposed through said first set of apertures to substantially define a first portion of a pixel opening through said second layer;

removing conductive material of said first layer exposed through said first portion of said pixel opening to substantially define a second portion of said pixel opening through said first layer;

disposing a second mask over the field emission array to prevent removal of semiconductive material of the semiconductive grid through said pixel opening.

2. The method of claim 1, wherein said second mask includes a second set of apertures substantially alignable between adjacent rows of pixels of the field emission array and wherein said second set of apertures facilitates removal of selected portions of said semiconductive grid from the field emission array.

3. The method of claim 2, further comprising removing passivation material of said second layer through said second set of apertures to expose a portion of said first layer through said second layer.

4. The method of claim 3, further comprising removing conductive material of said first layer exposed through said second layer.

5. The method of claim 1, wherein said first mask includes another set of apertures substantially alignable between adjacent rows of pixels of the field emission array.

6. The method of claim 5, further comprising removing passivation material of said second layer exposed through said another set of apertures to substantially define first portions of the row lines through said second layer.

7. The method of claim 6, further comprising removing conductive material of said first layer exposed between said first portions of the row lines to substantially define second portions of the row lines through said second layer.

8. The method of claim 7, further comprising removing portions of said semiconductive grid exposed between said first portions and said second portions of the row lines.

9. The method of claim 1, wherein said conductive material comprises metal or polysilicon.

10. The method of claim 1, wherein said passivation material comprises a glass, silicon oxide, or silicon nitride.

11. The method of claim 1, wherein said semiconductive grid comprises a semiconductive material.

12. The method of claim 11, wherein said semiconductive material comprises silicon.

13. The method of claim 1, wherein said disposing said first mask comprises:

disposing a photoresist over said second layer;

exposing selected areas of said photoresist to radiation; and developing said selected areas.

14. The method of claim 1, wherein said removing said passivation material comprises etching said passivation material.

15. The method of claim 1, wherein said removing said conductive material comprises etching said conductive material.

16. The method of claim 1, wherein said disposing said second mask comprises:

disposing photoresist over the field emission array;

exposing selected areas of said photoresist; and developing said selected areas.

17. The method of claim 8, wherein said removing said portions of said semiconductive grid comprises etching said portions of said semiconductive grid.

18. A method of fabricating row lines on a field emission array, comprising:

disposing a conductive layer over a planarized semiconductive layer of the field emission array;

disposing a passivation layer over the conductive layer;

removing portions of said semiconductive layer, said conductive layer, and said passivation layer disposed between adjacent rows of pixels of the field emission array; and removing other portions of said passivation layer and said conductive layer from above said pixels to define pixel openings.

19. The method of claim 18, wherein said removing said portions of said semiconductive layer, said conductive layer, and said passivation layer comprises disposing a mask over the field emission array and etching materials of each of said semiconductive layer, said conductive layer, and said passivation layer located beneath and substantially within a periphery of an aperture of said mask.

20. The method of claim 19, wherein said disposing said mask comprises:

disposing a photoresist over said passivation layer;

exposing selected regions of said photoresist; and developing said selected regions to define said aperture.

21. The method of claim 19, wherein said etching comprises dry etching at least one of said semiconductive layer, said conductive layer, and said passivation layer.

22. The method of claim 18, wherein said removing said other portions of said passivation layer and said conductive layer comprises:

disposing a mask including an aperture over said passivation layer;

etching a portion of said passivation layer exposed through said aperture to expose said conductive layer therethrough; and etching a portion of said conductive layer exposed through said passivation layer.

23. The method of claim 22, wherein said disposing said mask comprises:

disposing a photoresist over said passivation layer;

exposing selected regions of said photoresist; and developing said selected regions to define said aperture.

24. The method of claim 22, wherein said etching comprises dry etching at least one of said passivation layer and said conductive layer.

25. The method of claim 18, wherein said removing said portions of said conductive layer and said passivation layer and said removing other portions of said passivation layer and said conductive layer comprise employing a first mask including a first set of apertures alignable substantially between said adjacent rows and a second set of apertures alignable substantially above said adjacent rows of pixels.

26. The method of claim 25, wherein said removing said portions of said semiconductive material comprises employing a second mask including apertures alignable substantially between said adjacent rows.

27. The method of claim 25, wherein said removing said portions of said passivation layer is effected through said first set of apertures and said removing other portions of said passivation layer is effected through said second set of apertures to expose said conductive layer through said passivation layer.

28. The method of claim 27, wherein said removing said portions of said conductive layer and said removing other portions of said conductive layer are effected through said passivation layer to expose said portions of said semiconductive layer through said conductive layer.

29. The method of claim 28, wherein said removing said portions of said semiconductive layer comprises employing a second mask including apertures alignable substantially between said adjacent rows.

30. The method of claim 28, wherein said removing said portions of said semiconductive layer is effected through said conductive layer.

31. The method of claim 18, wherein said removing said portions of said semiconductive layer comprises employing a second mask including apertures alignable substantially between said adjacent rows.

32. The method of claim 18, wherein said removing said portions of said semiconductive layer, said conductive layer, and said passivation layer comprises exposing passivation material disposed beneath said semiconductive layer.

33. The method of claim 18, wherein said disposing said conductive layer comprises physical vapor depositing a conductive material on the field emission array.

34. The method of claim 18, wherein said disposing said conductive layer comprises chemical vapor depositing a conductive material on the field emission array.

35. The method of claim 18, wherein said disposing said conductive layer comprises:

disposing polysilicon on the field emission array; and doping said polysilicon with a dopant.

36. The method of claim 18, wherein said disposing said passivation layer comprises growing an oxide over said conductive layer.

37. The method of claim 18, wherein said disposing said passivation layer comprises disposing a material comprising silicon oxide over said conductive layer.

38. The method of claim 18, wherein said disposing said passivation layer comprises disposing a material comprising silicon nitride over said conductive layer.

39. The method of claim 18, wherein said removing said portions of said semiconductive layer, said conductive layer, and said passivation layer comprises disposing a first mask, including a first set of apertures alignable between said adjacent rows, over the field emission array; and wherein said removing said other portions of said passivation layer and said conductive layer comprises disposing a second mask, including a second set of apertures alignable substantially over said pixels, over the field emission array.

40. The method of claim 39, wherein said removing said portions of said semiconductive layer, said conductive layer, and said passivation layer comprises etching at least said passivation layer through said first set of apertures.

41. The method of claim 39, wherein said removing said other portions of said passivation layer and said conductive layer further comprises etching at least said passivation layer through said second set of apertures.

42. The method of claim 39, wherein said first mask further includes another set of apertures alignable substantially over said pixels.

43. The method of claim 42, wherein said removing said portions of said semiconductive layer and said passivation layer comprises etching at least said passivation layer through said first set of apertures.

44. The method of claim 42, wherein said removing said other portions of said passivation layer and said conductive layer comprises etching at least said passivation layer through said another set of apertures.

45. The method of claim 42, wherein said removing said portions of said semiconductive layer comprises etching said semiconductive layer through said second set of apertures.

* * * * *

UNITED STATES PATENT AND TRADEMARK OFFICE
CERTIFICATE OF CORRECTION

PATENT NO. : 6,008,063
DATED : December 28, 1999
INVENTOR(S) : Derraa

It is certified that error appears in the above-identified patent and that said Letters Patent is hereby corrected as shown below:

Title page,
Item [57], "Abstract,"
Line 18, change "second masks" to -- second mask is --.

Column 3,
Line 16, delete the comma after "underlying".

Column 10, claim 26,
Line 22, change "material" to -- layer --.

Signed and Sealed this

Sixth Day of November, 2001

*Attest:*

Nicholas P. Godici

NICHOLAS P. GODICI

*Attesting Officer* *Acting Director of the United States Patent and Trademark Office*